United States Patent
Chen et al.

(10) Patent No.: US 11,087,701 B1
(45) Date of Patent: Aug. 10, 2021

(54) HEAD MOUNTED DISPLAY WITH ANGLE COMPENSATION

(71) Applicant: Facebook Technologies, LLC, Menlo Park, CA (US)

(72) Inventors: Dong Chen, Foster City, CA (US); Rui Zhang, Redwood City, CA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/171,614

(22) Filed: Oct. 26, 2018

(51) Int. Cl.
| | |
|---|---|
| G09G 3/00 | (2006.01) |
| G09G 3/34 | (2006.01) |
| G09G 3/36 | (2006.01) |
| F21V 8/00 | (2006.01) |
| G02F 1/13357 | (2006.01) |
| H01L 27/32 | (2006.01) |
| G02F 1/1335 | (2006.01) |

(52) U.S. Cl.
CPC .......... *G09G 3/3426* (2013.01); *G02B 6/0046* (2013.01); *G02F 1/133603* (2013.01); *G02F 1/133611* (2013.01); *G09G 3/3611* (2013.01); *H01L 27/3232* (2013.01); *G02F 1/133612* (2021.01); *G09G 2320/0626* (2013.01)

(58) Field of Classification Search
CPC .............. G09G 3/3426; G09G 3/3611; G09G 2320/0626; H01L 27/3232; G02B 6/0046; G02F 1/133603; G02F 1/133611; G02F 2001/133612
See application file for complete search history.

(56) References Cited

U.S. PATENT DOCUMENTS

| | | | |
|---|---|---|---|
| 5,742,262 A | 4/1998 | Tabata et al. | |
| 9,442,292 B1 | 9/2016 | Gao et al. | |
| 10,055,887 B1* | 8/2018 | Gil | G02B 27/017 |
| 10,277,829 B1* | 4/2019 | Garrido | H04N 5/23245 |
| 10,288,884 B1* | 5/2019 | Gollier | G02B 27/0961 |
| 10,388,680 B2* | 8/2019 | Zheng | G09G 3/20 |
| 10,534,209 B1* | 1/2020 | Fu | G02F 1/13306 |
| 2007/0035707 A1* | 2/2007 | Margulis | G03B 21/26 |
| | | | 353/122 |
| 2008/0186393 A1* | 8/2008 | Lee | G09G 3/3406 |
| | | | 348/301 |
| 2008/0297894 A1* | 12/2008 | Kim | G02B 6/0078 |
| | | | 359/454 |
| 2009/0073540 A1* | 3/2009 | Kothari | G02B 26/001 |
| | | | 359/291 |

(Continued)

OTHER PUBLICATIONS

Non-Final Office Acation, U.S. Appl. No. 16/220,806, dated Jan. 24, 2020, 10 pages.

(Continued)

*Primary Examiner* — Ibrahim A Khan
(74) *Attorney, Agent, or Firm* — Freestone Intellectual Property Law PLLC; Aaron J. Visbeek; William J. Pigott

(57) ABSTRACT

A focusing lens is configured to focus display light for an eye of a user. A display is configured to emit the display light having an illumination profile that increases in brightness as a distance from a middle of the display increases. The focusing lens is configured to receive the display light and focus the display light as image light that has a brightness profile that has substantially uniform brightness across the image.

18 Claims, 13 Drawing Sheets

(56) References Cited

U.S. PATENT DOCUMENTS

| | | | |
|---|---|---|---|
| 2009/0295744 A1* | 12/2009 | Onishi | G06F 3/0412 |
| | | | 345/173 |
| 2010/0091027 A1 | 4/2010 | Oyama et al. | |
| 2011/0215990 A1* | 9/2011 | Liesenberg | G09G 5/00 |
| | | | 345/1.3 |
| 2015/0116354 A1* | 4/2015 | Tomlin | G06F 3/011 |
| | | | 345/633 |
| 2015/0205132 A1* | 7/2015 | Osterhout | G02B 27/0172 |
| | | | 345/633 |
| 2015/0260992 A1* | 9/2015 | Luttmann | G02B 27/0172 |
| | | | 359/631 |
| 2016/0373728 A1* | 12/2016 | Cho | H04N 5/2351 |
| 2017/0010407 A1* | 1/2017 | Huang | G02B 6/0046 |
| 2017/0039904 A1 | 2/2017 | Jepsen | |
| 2017/0317154 A1* | 11/2017 | Heo | H01L 51/5228 |
| 2018/0067322 A1 | 3/2018 | Alexander et al. | |
| 2018/0101230 A1 | 4/2018 | Vidal et al. | |
| 2018/0114298 A1 | 4/2018 | Malaika et al. | |
| 2018/0321426 A1 | 11/2018 | Weinstock et al. | |

OTHER PUBLICATIONS

Non-Final Office Action, U.S. Appl. No. 16/253,587, dated Feb. 19, 2020, 16 pages.

* cited by examiner

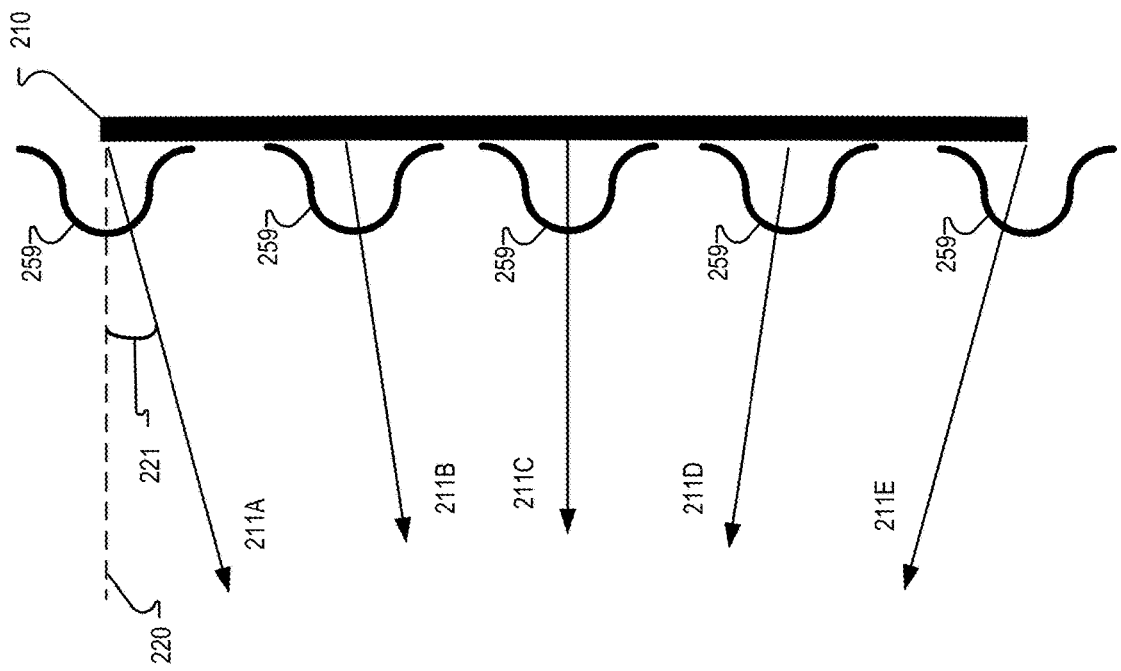
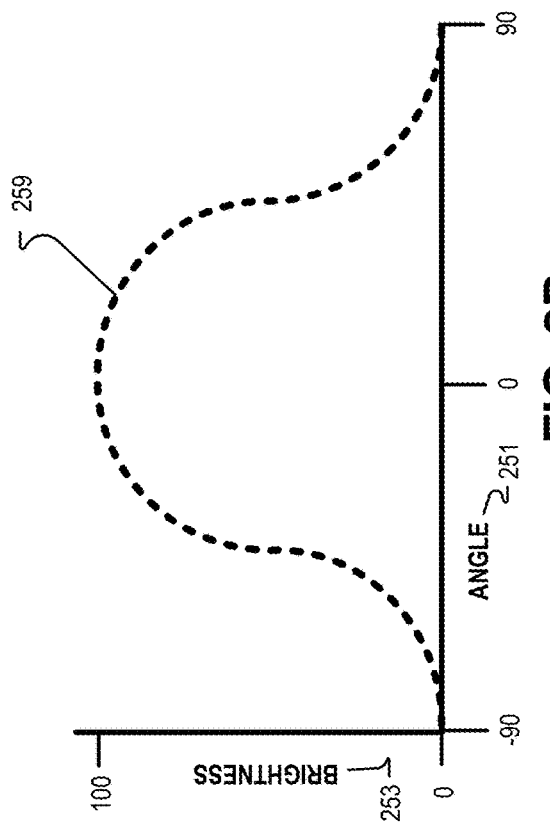
FIG. 2C
FIG. 2B

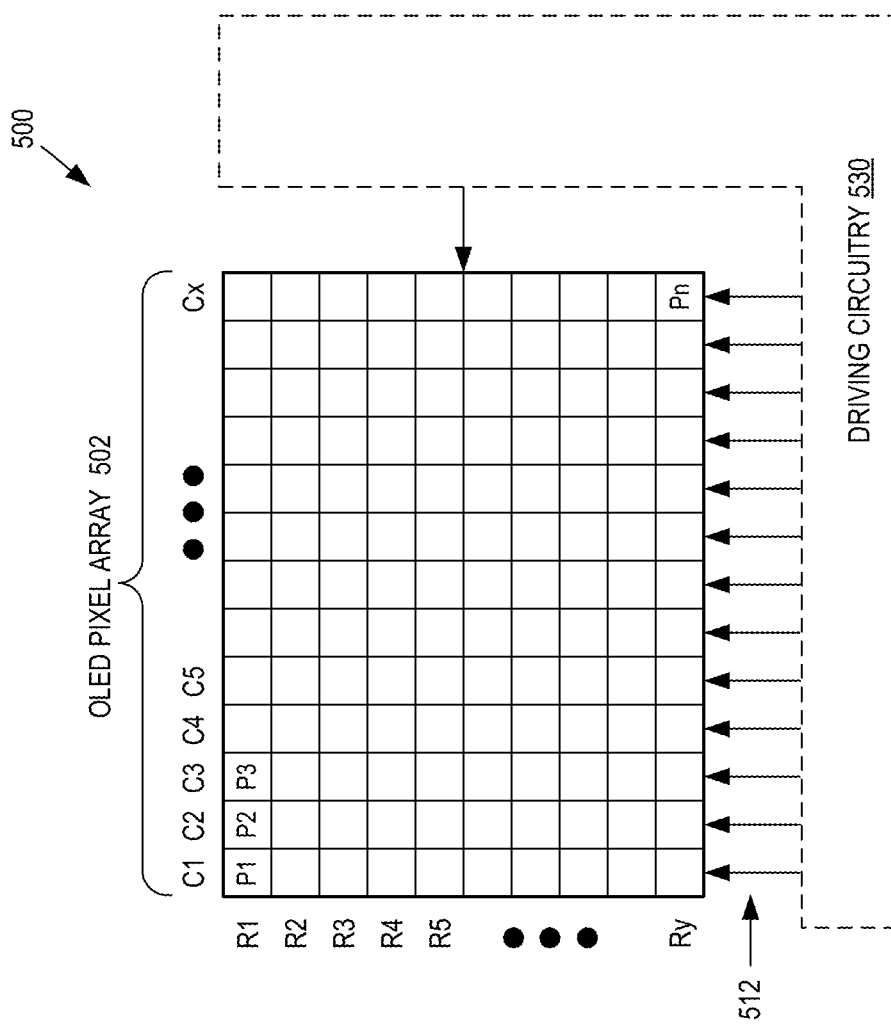

HEAD MOUNTED DISPLAY WITH ANGLE COMPENSATION

TECHNICAL FIELD

This disclosure relates generally to optics, and in particular to displays utilized in head mounted displays.

BACKGROUND INFORMATION

Head mounted displays (HMDs) may include a display for presenting images to a user of the HMD. The quality of the presented images may enhance the user experience and contribute to the feeling of "presence" that a user experiences when engaged in virtual reality, for example. Historically, the displays used in HMDs have leveraged the small displays designed for use in mobile electronics such as smartphones.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIGS. 2A-2C illustrate an HMD that includes a display and related brightness profiles.

FIG. 5 illustrates an example block diagram circuit that includes an organic light emitting diode (OLED) display, in accordance with embodiments of the disclosure.

DETAILED DESCRIPTION

Figure 1:
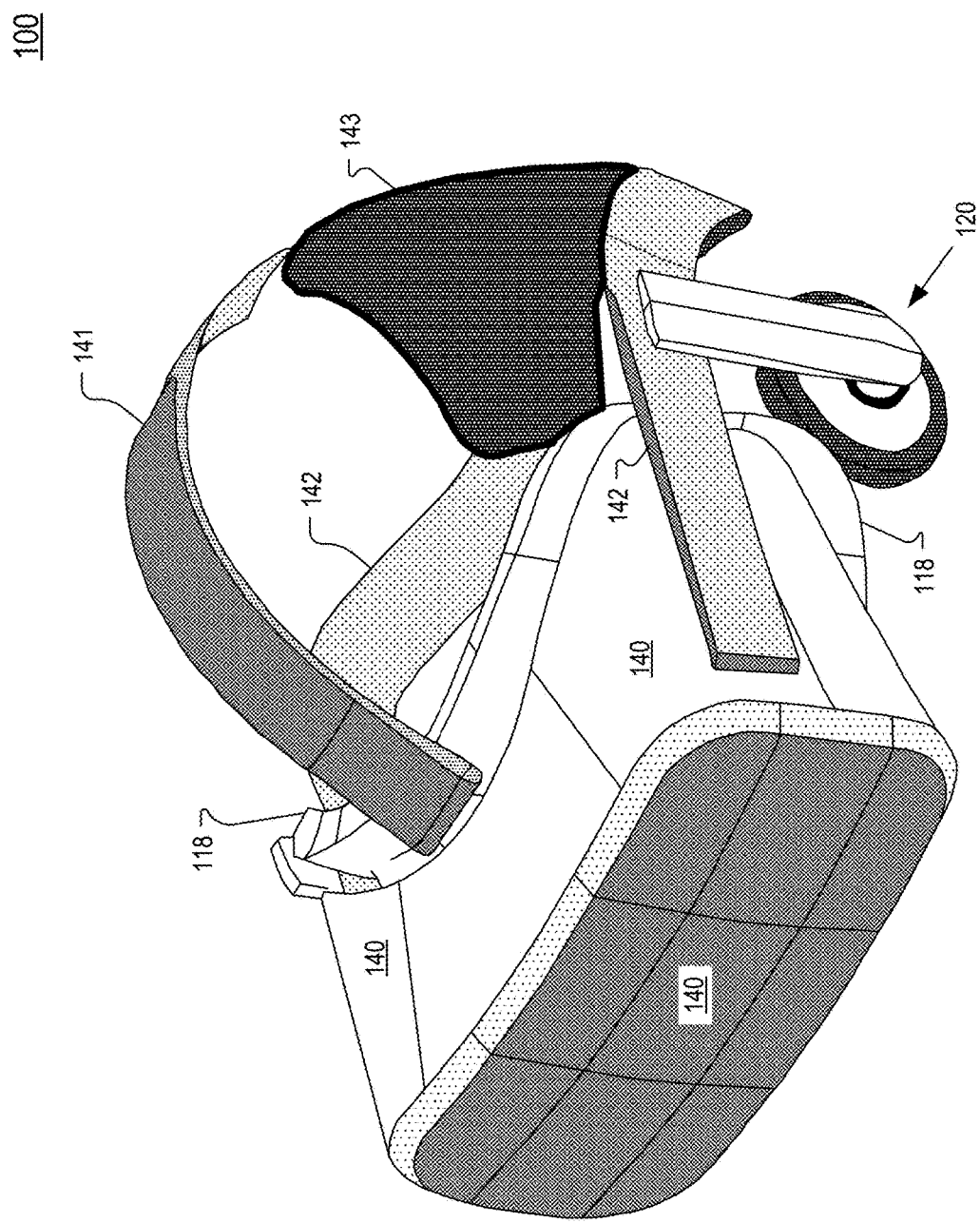
FIG. 1 illustrates an example head mounted display (HMD) that may include one or more angle compensated displays, in accordance with an embodiment of the disclosure.

Embodiments of an angle compensated display and a head mounted display (HMD) including an angle compensated display are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The angle compensated display and the HMD described in this disclosure provide substantially uniform brightness image light to a user of the HMD. When an HMD includes a lens for focusing display light for a user, the display light received at the center of the lens is typically approximately orthogonal to a two-dimensional pixel plane of the display while display light received at the edge of the lens is typically angled display light. Consequently, the display light received from the edge of the display has a lower brightness value than display light received from the middle of the display. For example, display light received at the center of the lens may be approximately 15-25% brighter than angled display light received at the edge of the lens. This display light brightness difference may result in images that get dimmer and dimmer toward the outside of the image and therefore negatively impact the quality of the viewing experience.

In embodiments of the disclosure, a display is configured to emit display light having an illumination profile that increases in brightness as a distance from the middle of the display increases so that the lens focusing the display light provides image with a brightness profile that is substantially uniform across the image. In one embodiment, an organic light emitting diode (OLED) display pixel array is driven so that the OLED display pixel increase in brightness as the OLED display pixels get farther from the middle of the display. In one embodiment, a backlight assembly of a backlit display pixel array is configured to illuminate the display pixel array according to the illumination profile that increase in brightness as a distance from the middle of the display pixel array increases. In one embodiment, a two-dimensional LED array used as a backlight illuminates a display pixel array with increasing brightness as a distance from the middle of the display pixel array increases. These and other embodiments are described in with respect to FIGS. 1-9 below.

FIG. 1 illustrates an example head mounted display (HMD) 100 that may include one or more angle compensated displays, in accordance with an embodiment of the disclosure. Example head mounted display (HMD) 100 includes a top structure 141, a rear securing structure 143, and a side structure 142 attached with a viewing structure 140 having a front rigid body 144. The illustrated HMD 100 is configured to be worn on a head of a user of the HMD. In one embodiment, top structure 141 includes a fabric strap that may include elastic. Side structure 142 and rear securing structure 143 may include a fabric as well as rigid structures (e.g. plastics) for securing the HMD to the head of the user. HMD 100 may optionally include earpiece(s) 120 configured to deliver audio to the ear(s) of a wearer of HMD 100.

In the illustrated embodiment, viewing structure 140 includes an interface membrane 118 for contacting a face of a wearer of HMD 100. Interface membrane 118 may function to block out some or all ambient light from reaching the eyes of the wearer of HMD 100.

Example HMD 100 also includes a chassis for supporting hardware of the viewing structure 140 of HMD 100. Hardware of viewing structure 140 may include any of processing logic, wired and/or wireless data interface for sending and receiving data, graphic processors, and one or more memories for storing data and computer-executable instructions. In one embodiment, viewing structure 140 may be configured to receive wired power. In one embodiment, viewing structure 140 is configured to be powered by one or more batteries. In one embodiment, viewing structure 140 may be configured to receive wired data including video data. In one embodiment, viewing structure 140 is configured to receive wireless data including video data.

Viewing structure 140 may include an angle compensated display for directing image light to a wearer of HMD 100. The display may include a Liquid Crystal Display (LCD) having a two-dimensional display pixel array of liquid crystal pixels arranged in rows and columns, for example. The display may include an organic light emitting diode (OLED) display, micro-LED display, quantum dot display, pico-projector, or liquid crystal on silicon (LCOS) display for directing image light to a wearer of HMD 100.

Figure 2A:
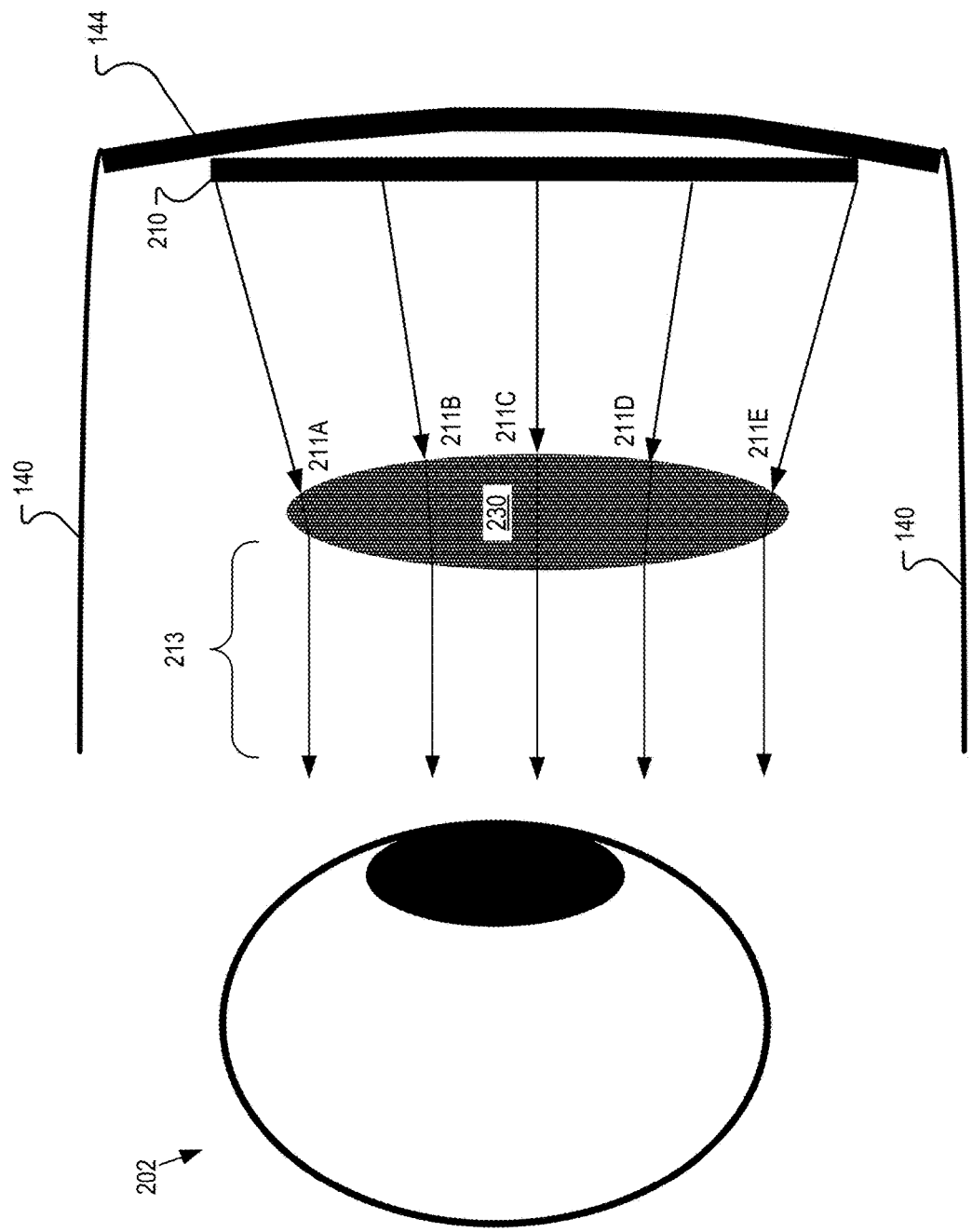

FIG. 2A illustrates a cut away view of HMD 100 that includes a display 210 and a lens assembly 230 configured to direct display light 211 to an eyebox area, in accordance with an embodiment of the disclosure. Display 210 may be rectangular, in some embodiments. Display 210 may include a Liquid Crystal Display (LCD) having a two-dimensional display pixel array of liquid crystal pixels arranged in rows and columns, for example. Display 210 may include an organic light emitting diode (OLED) display or micro-LED display. Lens assembly 230 is positioned to receive the display light 211 and direct the display light 211 to eye 202 as image light 213. Lens assembly 230 may be configured to allow eye 202 of a wearer of HMD 100 to focus on a virtual image displayed by display 210. In one embodiment, lens assembly 230 is a double-meniscus lens formed of a refractive material such as glass or plastic. Although FIG. 2A only illustrates one eye 202, an HMD may have a display 210 (or a portion of a shared display) and a lens assembly 230 for each eye of the user of the HMD.

FIG. 2B illustrates an example brightness profile 259 for display pixels of a display, in accordance with an embodiment of the disclosure. In FIG. 2B, a brightness value of brightness profile 259 is at its highest (e.g. brightness value of 100) when a viewing angle 251 of the display pixel is at zero. In other words, a given display pixel emits a highest value of display light along an emission axis that is approximately orthogonal to a two-dimensional pixel plane of the display pixel array. When the same display pixel is viewed at a viewing angle approaching 90 or −90, the brightness value is at its lowest (approaching zero). Those skilled in the art appreciate that brightness profile 259 is merely an example and understand that brightness profiles vary by display pixel technologies and may be dependent on additional factors such as the filter stack disposed over a given display pixel array.

FIG. 2C illustrates an example brightness profile 259 overlaying various rays of display light 211. In FIG. 2C, display light ray 211C is emitted from a center of display 210 and has a baseline brightness value or a brightness value that approaches a baseline brightness value. Lens 230 may be disposed to receive display light ray 211C in a center of the lens that corresponds with a central optical axis of the lens 230. Display light rays 211A and 211E have a brightness value that is significantly less (e.g. 15-25% less) than a baseline brightness value since lens 230 may receive rays 211A and 211E at slight angles from the orthogonal axis 220 of the display pixel that emits rays 211A and 211E. FIG. 2C illustrates an example orthogonal axis 220 that is orthogonal to a pixel plane of the display pixel array of display 210. Notably, display light ray 211A is offset from orthogonal axis 220 by angle 221, and consequently, the brightness value of ray 211A is significantly less than a baseline brightness value (e.g. brightness value of 100) of the display pixel that emits ray 211A. While the display pixel that emits ray 211A may also emit display light along orthogonal axis 220 that has the baseline brightness value, that ray of display light emitted along orthogonal axis 220 is not received by lens 230 and thus is not focused for the eye 202 of a user of the HMD. Display light ray 211E is emitted at a similar angle 221 and thus similar brightness value as display light ray 211A.

Display light rays 211B and 211D may have a brightness value that is between the baseline brightness value of ray 211C and the brightness value of rays 211A or 211E since rays 211B and 211D are emitted at angles that are less than angle 221. Given that the brightness value of emitted display light generally decreases as the offset angle 221 increases, the display light 211 that is focused by lens 230 may decrease in brightness as a position of a given display pixel increases in distance from the center of display 210. This may result in image light 213 (illustrated in FIG. 2A) being presented to eye 202 being progressively dimmer as the distance from a center of the image increases.

Figure 3:
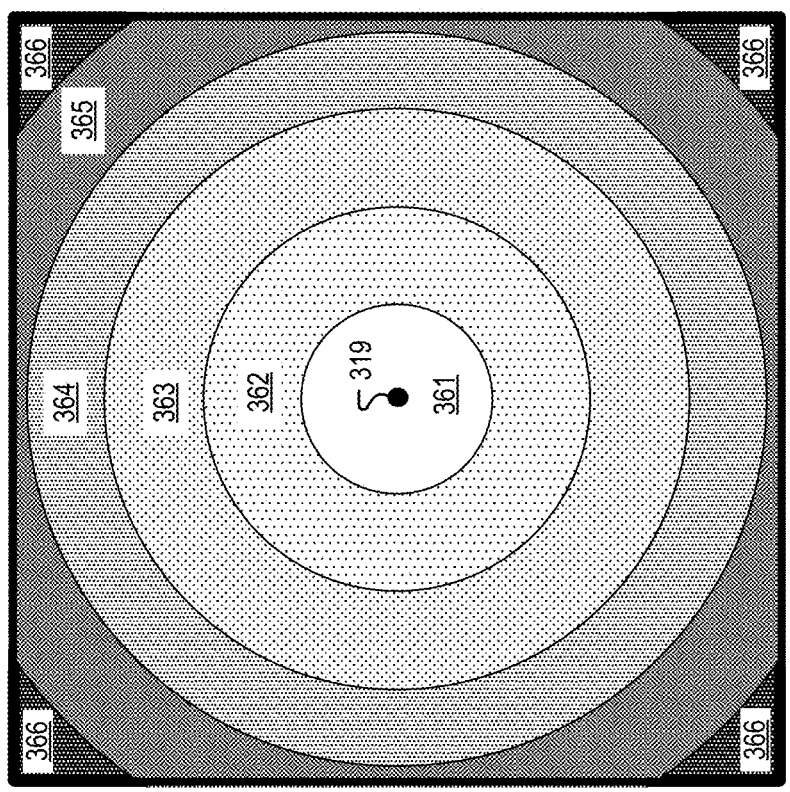
FIG. 3 illustrates an example image brightness profile that may be seen by a user viewing a conventional display in a head mounted display after the image propagates through a lens.

FIG. 3 illustrates an example image brightness profile 369 that may be seen by a user viewing a conventional display in a head mounted display after the image propagates through a lens. In image brightness profile 369, center image region 361 is brightest because the rays propagating through a center of the lens (e.g. 230) are approximately orthogonal to a pixel plane of a display and thus have a high baseline brightness value. As the offset angle 221 (offset from an axis orthogonal to a given display pixel) increases, the rays received by a lens in an HMD may become dimmer. Consequently, illustrated image region 362 is dimmer than center image region 361, image region 363 is dimmer than image region 362, image region 364 is dimmer than region 363, image region 365 is dimmer than region 364, and image region 366 is dimmer than region 365. In FIG. 3, the image brightness decreases as a distance from a middle 319 of the image brightness profile 369 increases. Referring back to FIG. 2C, ray 211C may contribute to region 365 or 366 while ray 211C may contribute to center image region 361.

Figure 4A:
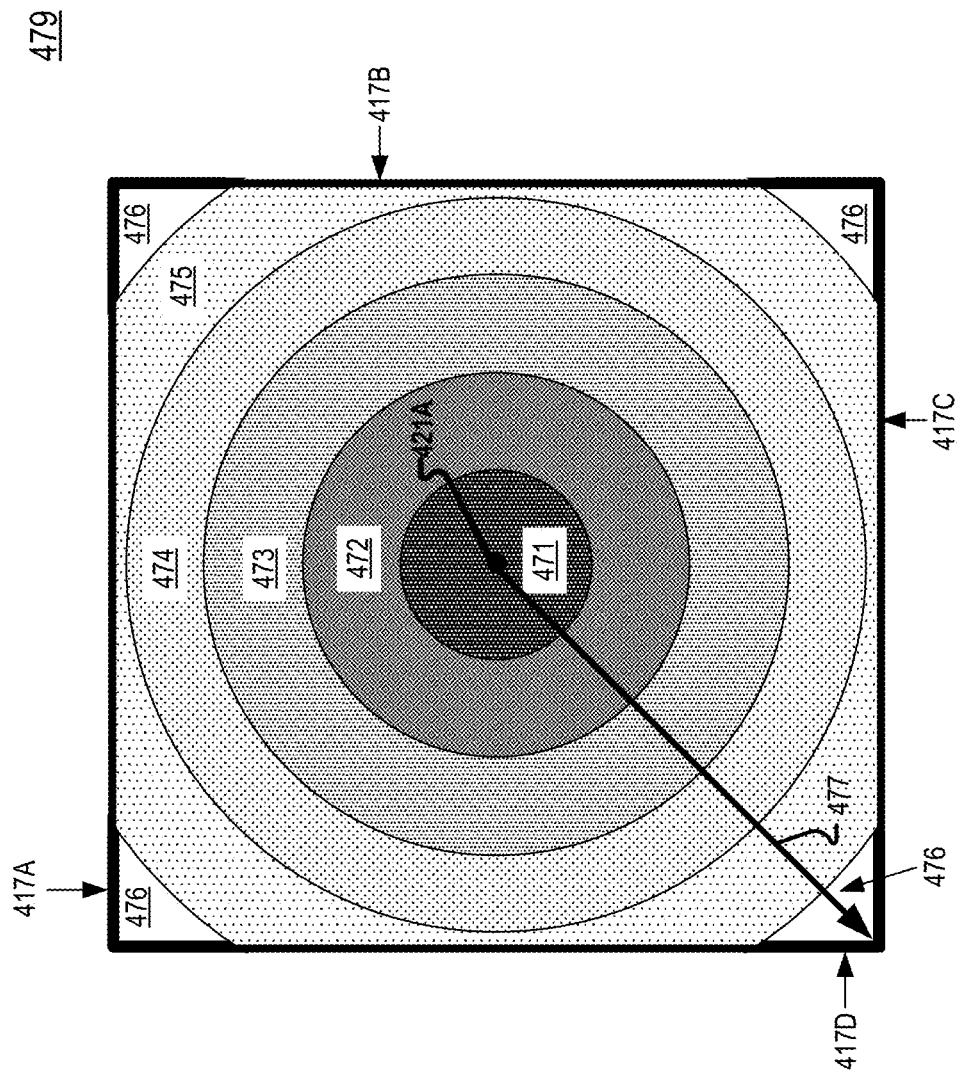
FIGS. 4A-4B illustrate example illumination profiles that may be utilized, in accordance with embodiments of the disclosure.

FIG. 4A illustrates an example illumination profile 479 that may be utilized in accordance with embodiments of the disclosure. Illumination profile 479 may be utilized in various ways to offset or neutralize the image brightness profile 369 illustrated in FIG. 3 so that user of an HMD is presented with an image or images that have uniform or substantially uniform brightness across the image. It is understood by those skilled in the art that example image brightness profile 369 and example illumination profile 479 are illustrated as rectangles and that displays and the images presented by the display may be squares, rectangle, hexagonal, or other shapes.

In illumination profile 479, center region 471 is dimmest while region 476 is the brightest. Illumination profile 479 increases in brightness as a distance from the middle 421A of the illumination profile increases. Illumination profile 479 decreases in brightness as a position in the illumination profile 479 gets farther from any of edges 417A-D and closer to middle 421A. Middle 421A of illumination profile 479 may correspond with a middle of a display pixel array of a display. Region 476 is brighter than region 475, region 475 is brighter than region 474, region 474 is brighter than region 473, region 473 is brighter than region 472, and region 472 is brighter than region 472. In FIG. 4A, regions 471-476 are illustrated as concentric illumination regions that increase in brightness as the concentric illumination rings get larger. In one embodiment, region 476 is approximately 20% brighter than a brightness value of middle 421A.

Figure 4B:
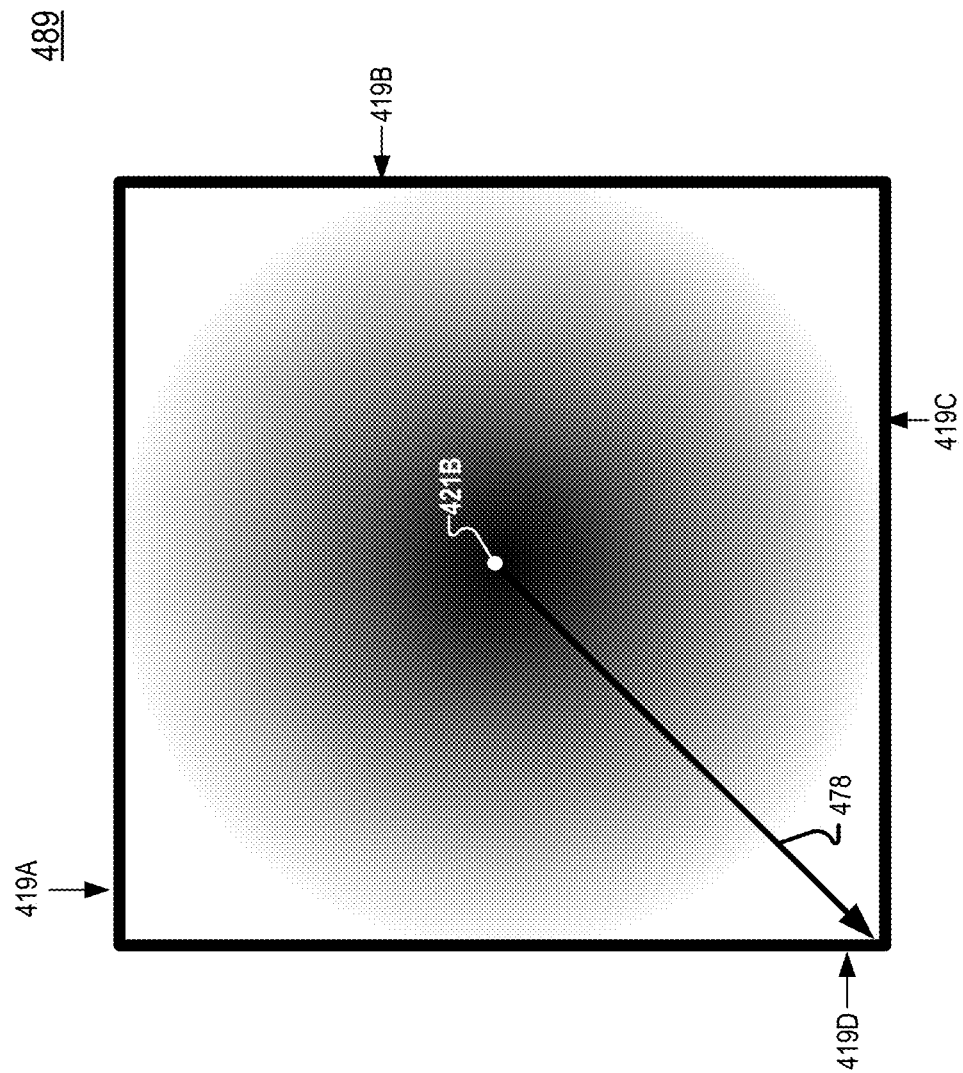

While regions 471 through 476 are illustrated as only 5 discrete regions of brightness in FIG. 4A, the boundaries of the regions may not necessarily be distinct, in some embodiments. FIG. 4B shows an example illumination profile 489 having an illumination gradient 478 that progressively increases in brightness as a distance from the middle 421B of the illumination gradient 478 increases. Middle 421B of illumination profile 489 may correspond with a middle of a display pixel array of a display. In illumination profile 489, the highest brightness value of the illumination gradient 478 is at the edges 419A-D of illumination profile 489. In the particular illustrated example, illumination gradient 478 runs from middle 421B to the intersection of edges 419C and 419D of illumination profile 489. In FIG. 4B, gradient 478 runs from the middle 421B outward in a circle although only arrow 478 is illustrated. When a display is shaped as a rectangle, a gradient mapping of the illumination profile may be shaped as an ellipse.

FIG. 5 illustrates an example block diagram circuit that includes an organic light emitting diode (OLED) display 500, in accordance with embodiments of the disclosure. OLED display 500 includes a two-dimensional OLED display pixel array 502 arranged in "y" rows and "x" columns. In the illustrated embodiment, OLED display pixel array 502 includes OLED display pixels P1-Pn where numeral "n" represents a total number of OLED display pixels. Numeral "n" may be the product of the number of rows (y) and the number of columns (x). Display 500 also includes pixel driving circuitry 530 that is configured to drive OLED display pixel array 502 with increasing brightness as OLED display pixels in the array 502 get farther from the middle of the display. Pixel driving circuitry 530 may be configured to drive illumination profile 479 or 489 onto OLED display pixel array 502, for example. In this case, an image driven onto OLED display pixel array 502 may be driven approximately 20% brighter at the edges of array 502 compared to a middle of array 502. Drive lines 512 may be driven by pixel driving circuitry 530 to drive pixel values (corresponding to received images) onto Red/Green/Blue (RGB) pixels or Red/Green/Green/Blue (RGGB) pixels to generate images Pixel driving circuitry 530 may be located, at least in part, at a location that is local (a.k.a. "in-pixel") to each OLED display pixel. In one embodiment, a transistor associated with a given OLED pixel is configured to be driven with more current as the OLED pixels increase in distance from the middle of array 502. This may be accomplished by adjusting a value of a resistor coupled to the transistor, among other techniques. Those skilled in the art understand that the described pixel driving circuitry 530 may be used similarly to drive an illumination profile on a display pixel array that includes micro-LEDs or other display technologies that have an emissive pixel architecture.

Liquid crystal displays (LCDs) are considered transmissive display architectures in that LCD pixel arrays are generally backlit by a backlight assembly and the LCD display pixels are driven to transmit or block the illumination light provided by a backlight. LEDs and cold-cathode-fluorescent bulbs are often utilized as backlight emitters in backlight assemblies, for example. In backlit architectures, a lightguide may be used to diffuse and/or distribute illumination light to illuminate a display pixel array such as an LCD display pixel array.

Figure 6:
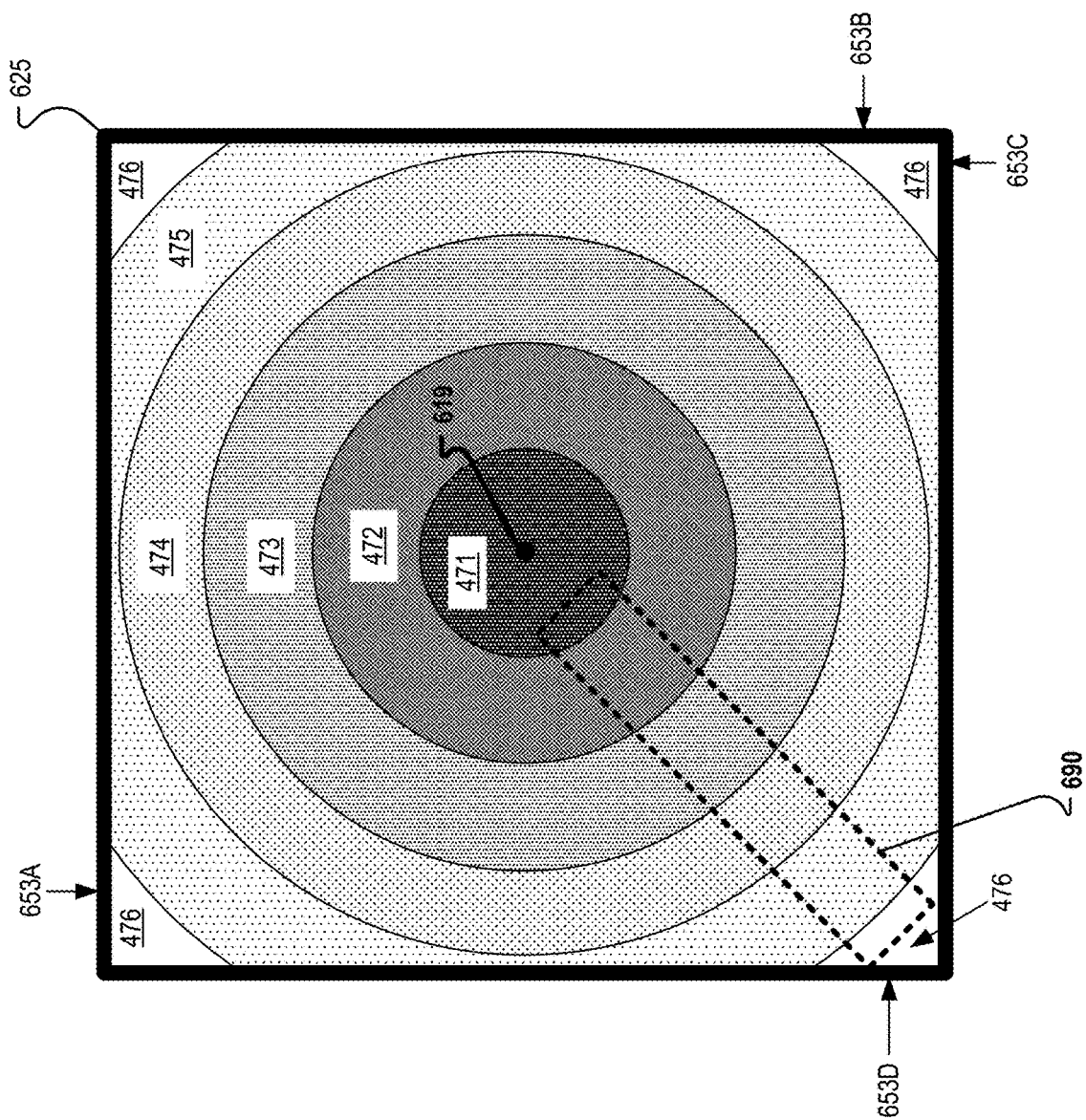
FIG. 6 illustrates an example top view of a lightguide configured to generate an example illumination profile for illuminating a display pixel array, in accordance with an embodiment of the disclosure.

FIG. 6 illustrates an example top view of a lightguide 625 configured to generate example illumination profile 479 for illuminating a display pixel array, in accordance with an embodiment of the disclosure. Lightguide 625 includes a middle 619 and edges 653A-D. FIG. 6 illustrates that illumination profile 479 may be generated by arranging light extraction features in a lightguide of a backlight that will illuminate a display.

Figure 7A:
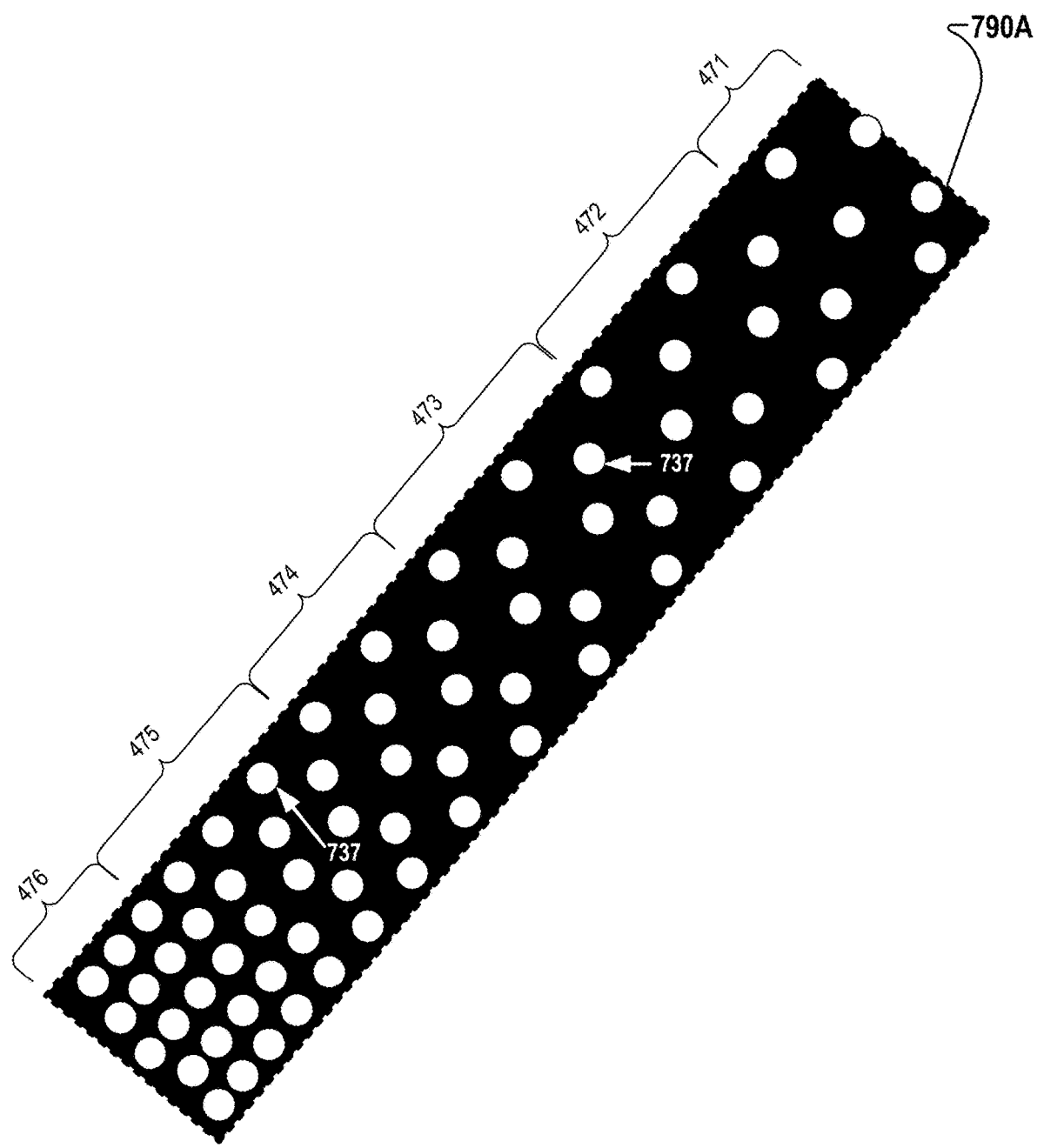
FIGS. 7A-7B illustrate a zoomed-in example region that shows an example arrangement of extraction features that may be used in a region of FIG. 6, in accordance with an embodiment of the disclosure.

FIG. 7A illustrates a zoomed-in example region 790A that shows an example arrangement of extraction features that may be used in region 690 of FIG. 6, in accordance with embodiments of the disclosure. Example region 790A illustrates a plurality of dot features 737 arranged in a gradient so that there is a progressively increasing density of the dots 737 as a distance from a middle 619 of lightguide 625 increases. This allows for progressively more illumination of a display pixel array as a position in the lightguide 625 increases in distance from middle 619.

The dot features 737 may be implemented as voids in a reflective layer of a lightguide (e.g. lightguide 625). The white voids (shaped as dots) allow illumination light confined to the lightguide to escape to illuminate a display pixel array while the rest of the reflective layer (illustrated as black fill) of the reflective layer reflects the illumination light back into the lightguide. While circular dots are illustrated as the shape of an example light extraction feature in FIG. 7A, it is understood that other shapes may be used in light extraction features to provide an illumination gradient.

Figure 7B:
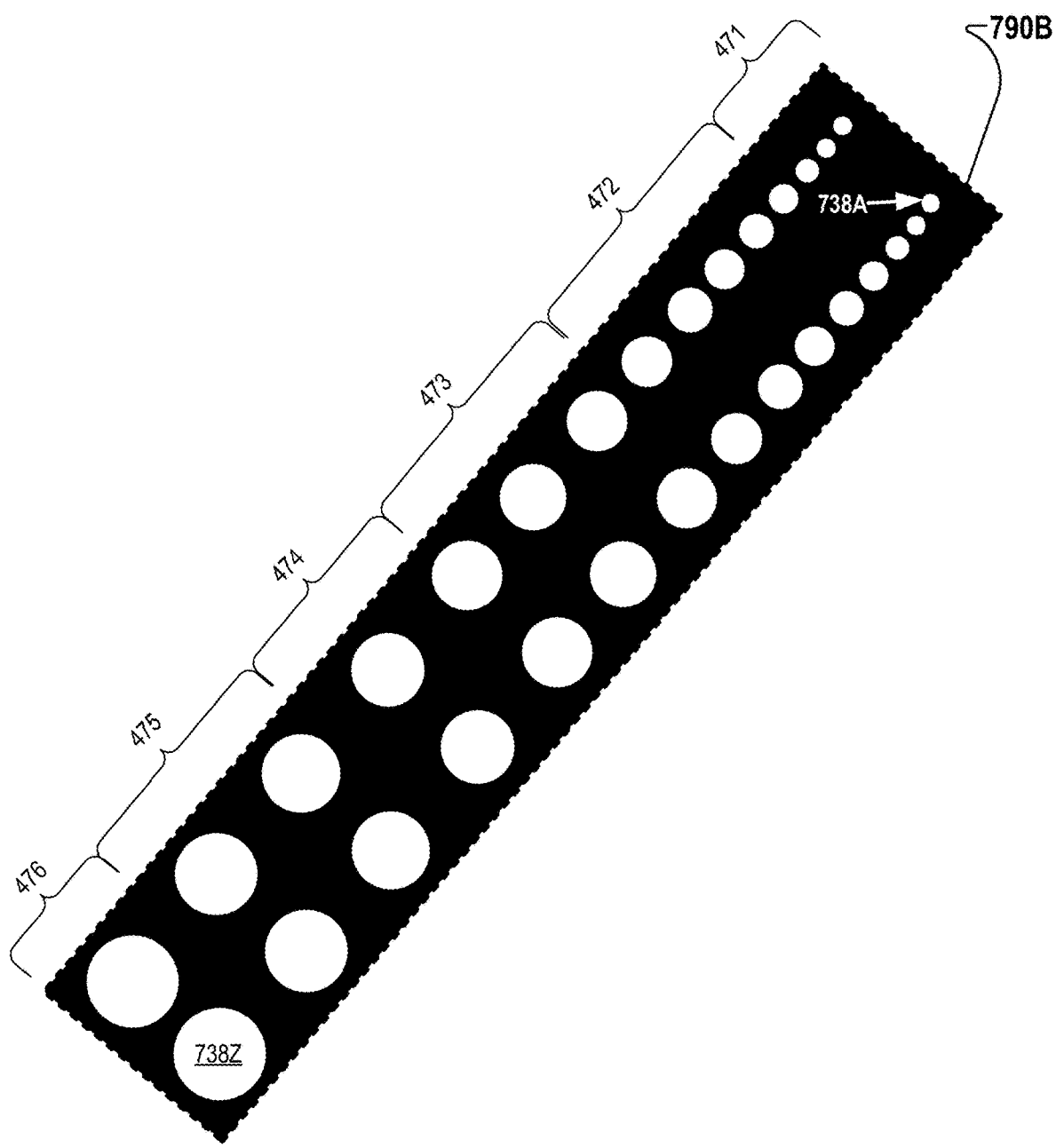

FIG. 7B illustrates a zoomed in example view 790B that shows an example arrangement of extraction features that may be used in region 690 of FIG. 6, in accordance with an embodiment of the disclosure. In FIG. 7B, dot 738A has a radius that is less than the radius of example dot 738Z. This allows for progressively increased brightness as the distance from the middle of the lightguide (and the display that includes the lightguide) increases. A highest brightness value of an illumination gradient may be at the edge of the lightguide (and the display illuminated by the lightguide) and a lowest brightness value of the illumination gradient may be at the middle of the display.

The dot features 738 may be implemented as voids in a reflective layer of a lightguide (e.g. lightguide 625). The white voids (shaped as dots) allow illumination light confined to the lightguide to escape to illuminate a display pixel array while the rest of the reflective layer (illustrated as black fill) of the reflective layer reflects the illumination light back into the lightguide. While circular dots are illustrated as the shape of an example light extraction feature in FIG. 7B, it is understood that other shapes may be used in light extraction features to provide an illumination gradient.

Figure 8A:
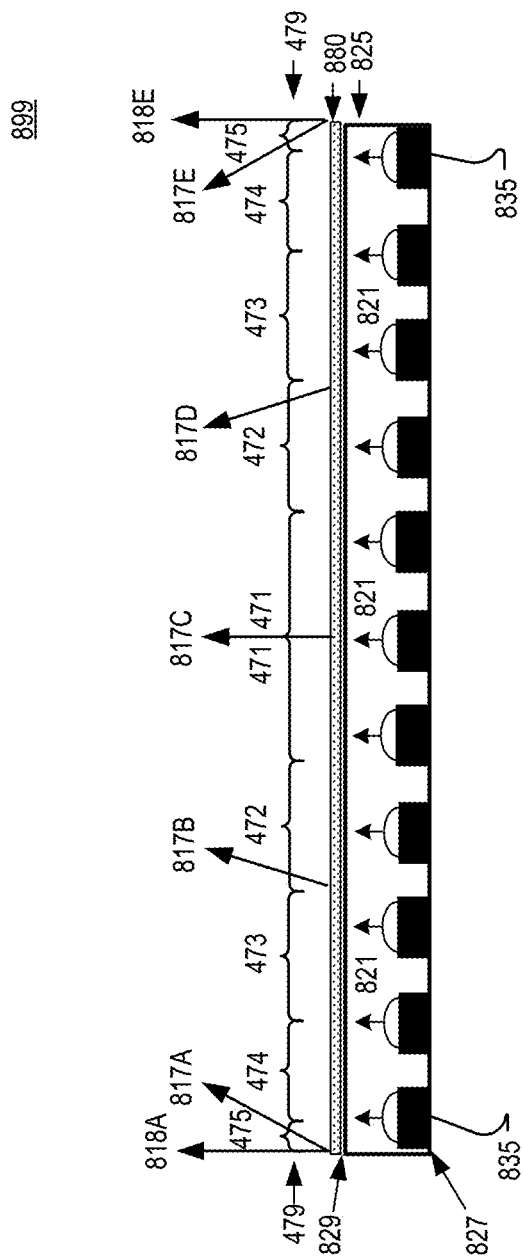
FIGS. 8A-8B illustrate side views of example angle compensated backlights and a display that generates an angle compensated illumination profile, in accordance with an embodiment of the disclosure.

FIG. 8A illustrates a side view of an example angle compensated backlight assembly 899 having backlight emitters 835 and a lightguide 825 that generates illumination profile 479, in accordance with an embodiment of the disclosure. FIG. 8A illustrates a direct-lit configuration where backlight emitters 835 emit illumination light 821 into lightguide 825. Lightguide 825 is configured to receive the illumination light 821 from the backlight emitters 835 and distribute the illumination light 821 to illuminate a display pixel array according to an illumination profile (e.g.

479 or 489) Backlight emitter(s) 835 may include one or more strings of white LEDs (emitting white visible light) or red/green/blue LEDs being spaced with a sufficient mixing distance to allow the red, green, and blue light to mix into white light for illuminating a display pixel array.

In the illustrated embodiment, lightguide 825 may be coated with a reflective material to recycle (reflect) emitted light 821 to be directed to an extraction side 828 of the lightguide 825. An extraction layer 880 may be included in lightguide 825. Extraction layer 880 may include the extraction features described in FIGS. 7A and 7B for example to illuminate a display pixel array according to illumination profile 479. Extraction layer 880 may include a reflective material that includes voids as the extraction features, for example.

Angle compensated backlight assembly 899 emits example rays 817A, 817B, 817C, 817D, and 817E. Rays 817A, 817B, 817C, 817D, and 817E may have a substantially same brightness value. Ray 818A emitted from a same position as angle offset ray 817A may have a brightness value that is 15-25% brighter than a brightness value of ray 817C so that ray 817A has the same brightness value as ray 817C, for example. Similarly, ray 818E emitted from a same position as angle offset ray 817E may have a brightness value that is 15-25% brighter than a brightness value of angle offset ray 817C so that ray 817A has the same brightness value as ray 817C, for example. This may ensure that image light focused by a lens (e.g. lens 230) has a brightness profile that has substantially uniform brightness across the image when a display pixel array is backlit by angle compensated backlight assembly 899.

Figure 8B:
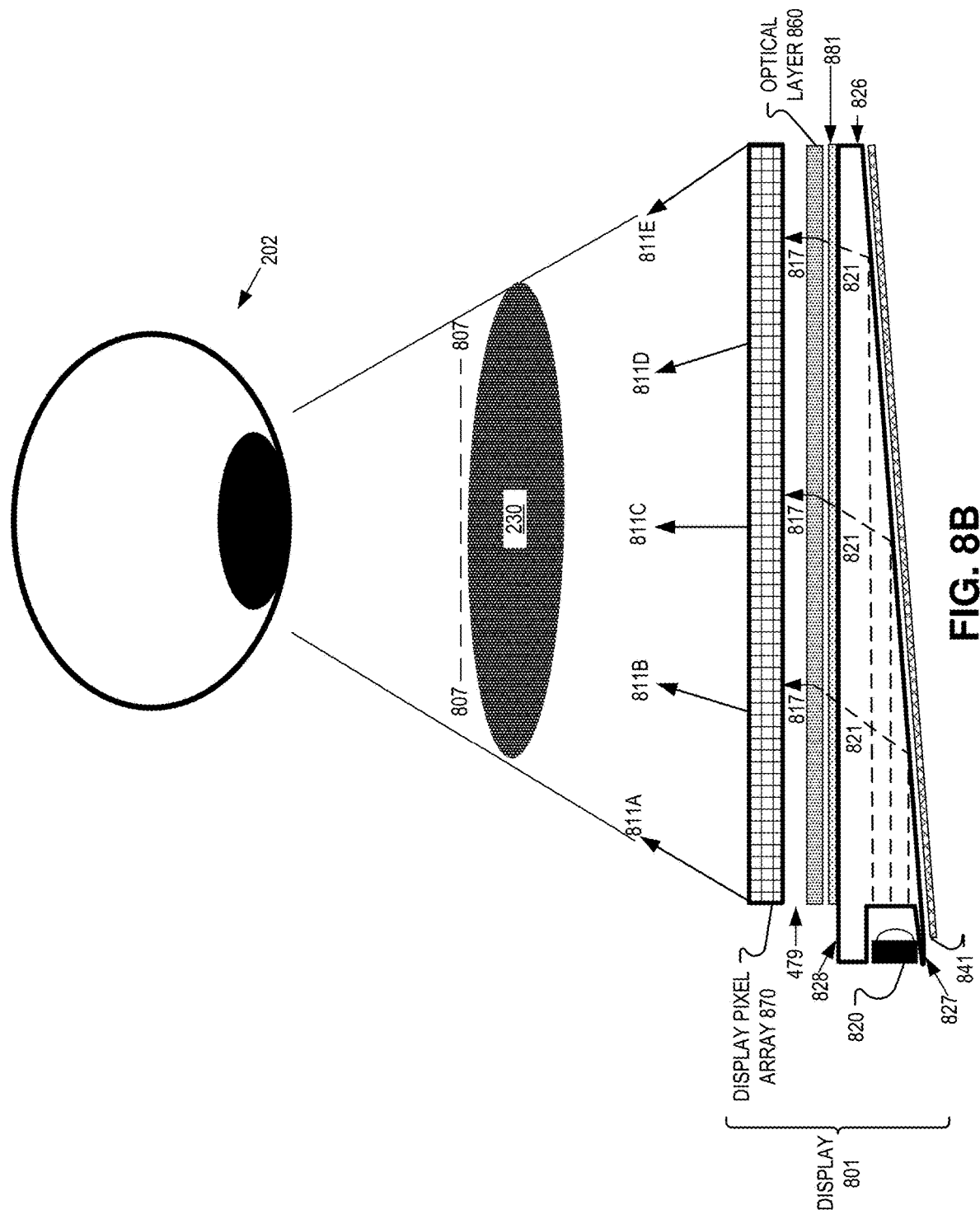

FIG. 8B illustrates a side view of an example edge-lit display 801 that generates an angle compensated illumination profile, in accordance with an embodiment of the disclosure. FIG. 8B illustrates an edge-lit configuration where one or more backlight emitters 820 emit illumination light 821 into lightguide 826. Backlight emitter(s) 820 may include a string of white LEDs (emitting white visible light) or red/green/blue LEDs being spaced with a sufficient mixing distance to allow the red, green, and blue light to mix into white light for illuminating a display pixel array.

In the illustrated embodiment, lightguide 826 is a wedge-shaped lightguide. Lightguide 826 is configured to receive the illumination light 821 from the backlight emitters 820 and distribute the illumination light 821 to illuminate display pixel array 870 according to illumination profile 479. Lightguide 826 may be formed of a refractive material such as polymethyl methacrylate (PMMA). In other embodiments, lightguide 826 may not be wedge-shaped. Lightguide 826 may include a reflective layer 841 and an extraction layer 881. In some embodiments, reflective layer 841 is coupled to an angled bottomside 827 of lightguide 826 to receive and direct illumination light 821 emitted by backlight emitter(s) 820 out an extraction side 828 of the lightguide 826 to illuminate display pixel array 870. The extraction side 828 is opposite the angled bottomside 827 in the illustrated embodiment.

Lightguide 826 may rely on reflective surfaces such as reflective layer 841 to confine the illumination light to the lightguide 826 prior to exiting the extraction side 828 as illumination light 817 for illuminating a display pixel array. Reflective layer 841 may include a mirrored surface or a white reflective surface that reflects over 95% of incident visible light. Lightguide 826 may also rely on total internal reflection (TIR) to confine the illumination light to lightguide 826 prior to exiting the extraction side 828 as illumination light 817 for illuminating a display pixel array. A combination of TIR and reflective layers on the edges of lightguide 826 may also be used.

As illustrated, the edge-lit configuration of FIG. 8B generates the illumination profile 479 of FIG. 4. The edge-lit configuration of FIG. 8B may also generate illumination profile 489. In embodiments where light extraction features are voids in a reflective layer, the reflective layer may be included in extraction layer 881 on the extraction side 828 of lightguide 826. In some embodiments, the extraction features are formed in a refractive material of the lightguide 826. For example, concave or convex dome structures may be formed in the extraction side 828 of lightguide 826 to assist illumination light propagating in lightguide 826 to overcome the critical angle to escape lightguide 826 as illumination light 817. The concave or convex dome structures may have similar radii and may be arranged similarly to the dot features 737/738 of FIGS. 7A and 7B, respectively.

In FIG. 8B display pixel array 870 is illuminated by illumination light 817 having illumination profile 479. Display pixel array 870 emits display light having an illumination profile that increases in brightness as a distance from a middle of the display 801 increases so that the display light that is received by the focusing lens 230 (e.g. rays 811A-E) has a brightness profile that is substantially uniform. Focusing lens 230 is configured to receive the display light and focus the display light as image light 807 that has a brightness profile that has substantially uniform brightness across the image. Consequently, eye 202 is presented with an image that is substantially uniform in brightness rather than an image that becomes increasingly darker toward the edges of the images, as in conventional HMDs. To achieve an angle compensated display, the display pixel array 870 and the focusing lens 230 may need to be tuned together so that the display light 811 that is received by lens 230 is focused as an image with substantially uniform brightness across image light 807. Focusing lens 230 may include a central optical axis in the middle of focusing lens 230 and the central optical axis of the focusing lens 230 may run through the middle of the display pixel array 870 and display 801.

Figure 9:
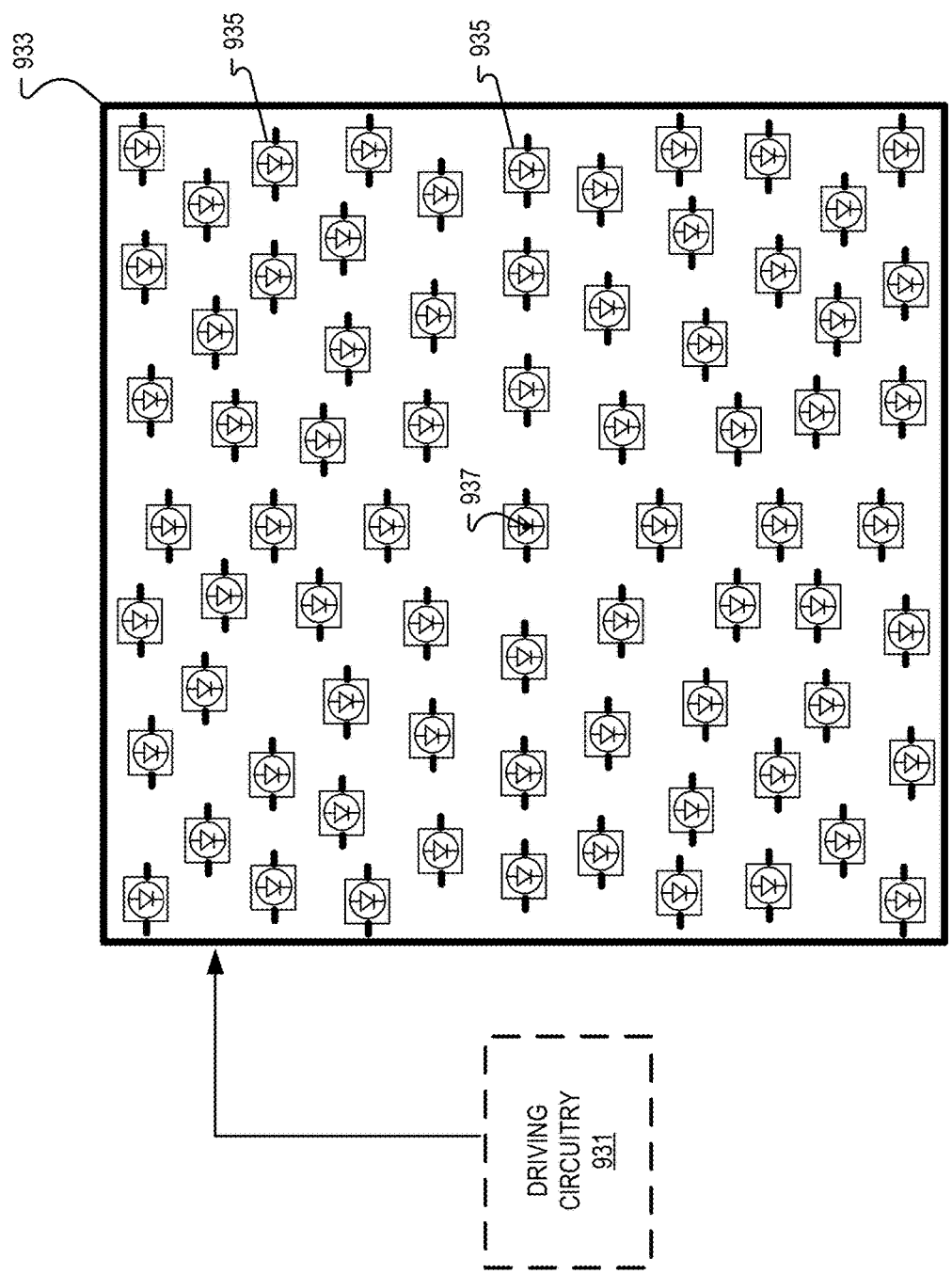
FIG. 9 illustrates an example two-dimensional array of backlight LEDs arranged on a backlight layer, in accordance with an embodiment of the disclosure.

FIG. 9 illustrates an example two-dimensional array of backlight LEDs 935 arranged on a backlight layer 933, in accordance with an embodiment of the disclosure. Driving circuitry 931 is configured to drive the two-dimensional array of backlight LEDs 935. FIG. 9 illustrates an array of backlight LEDs that may be used in direct-lit display architectures where the two-dimensional array of backlight LEDs are arranged on backlight layer 933 to illuminate a display pixel array (e.g. LCD display pixel array) that is shaped similarly to backlight layer 933. In FIG. 9, a density of the backlight LEDs 935 increases as a distance from a middle 937 of the two-dimensional array of backlight LEDs increases. In some embodiments, the density of backlight LEDs is substantially uniform. In some embodiments, driving circuitry 931 may be configured to drive backlight LEDs 935 with increasing brightness as a distance from a middle 937 of the two-dimensional array of backlight LEDs increases in order to increase the brightness as the edges of the two-dimensional array of backlight LEDs to generate an illumination profile such as profile 479 or 489.

The term "processing logic" in this disclosure may include one or more processors, microprocessors, multi-core processors, Application-specific integrated circuits (ASIC), and/or Field Programmable Gate Arrays (FPGAs) to execute operations disclosed herein. In some embodiments, memories (not illustrated) are integrated into the processing logic to store instructions to execute operations and/or store data.

Processing logic may also include analog or digital circuitry to perform the operations in accordance with embodiments of the disclosure.

A "memory" or "memories" described in this disclosure may include one or more volatile or non-volatile memory architectures. The "memory" or "memories" may be removable and non-removable media implemented in any method or technology for storage of information such as computer-readable instructions, data structures, program modules, or other data. Example memory technologies may include RAM, ROM, EEPROM, flash memory, CD-ROM, digital versatile disks (DVD), high-definition multimedia/data storage disks, or other optical storage, magnetic cassettes, magnetic tape, magnetic disk storage or other magnetic storage devices, or any other non-transmission medium that can be used to store information for access by a computing device.

Communication channels may include or be routed through one or more wired or wireless communication utilizing IEEE 802.11 protocols, BlueTooth, SPI (Serial Peripheral Interface), $I^2C$ (Inter-Integrated Circuit), USB (Universal Serial Port), CAN (Controller Area Network), cellular data protocols (e.g. 3G, 4G, LTE, 5G), optical communication networks, Internet Service Providers (ISPs), a peer-to-peer network, a Local Area Network (LAN), a Wide Area Network (WAN), a public network (e.g. "the Internet"), a private network, a satellite network, or otherwise.

A computing device may include a desktop computer, a laptop computer, a tablet, a phablet, a smartphone, a feature phone, a server computer, or otherwise. A server computer may be located remotely in a data center or be stored locally.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A head mounted display (HMD) comprising:
   a focusing lens configured to focus display light at an eyebox; and
   a display configured to emit the display light having an illumination profile that is non-uniform, wherein the display includes a lightguide to generate the illumination profile that is non-uniform and that progressively increases in brightness from a middle of the lightguide to each edge of the lightguide, and wherein the focusing lens is configured to receive the display light and focus the display light as image light that has a brightness profile that has substantially uniform brightness across the image at the eyebox.

2. The HMD of claim 1, wherein the illumination profile includes an illumination gradient that progressively increases the brightness as the distance from a middle of the display increases, a highest brightness value of the illumination gradient being at an edge of the display and a lowest brightness value of the illumination gradient being at the middle of the display.

3. The HMD of claim 1, wherein the display includes:
   a display pixel array; and
   a backlight emitter to provide illumination light, wherein the lightguide is configured to receive the illumination light from the backlight emitter and distribute the illumination light to illuminate the display pixel array according to the illumination profile.

4. The HMD of claim 3, wherein the display is configured in an edge-lit architecture.

5. The HMD of claim 3, wherein the lightguide includes a gradient of light extraction features that provides the illumination profile, and wherein the light extraction features output a higher brightness value of the illumination light as a particular light extraction feature gets farther from the middle of the lightguide and gets closer to an edge of the display pixel array.

6. The HMD of claim 1, wherein the display includes:
   a liquid crystal display pixel array arranged in rows and columns;
   a two-dimensional array of backlight light emitting diodes (LEDs) for illuminating the liquid crystal display pixel array; and
   pixel driving circuitry configured to drive the backlight LEDs with increasing brightness as a distance from a middle of the two-dimensional array of backlight LEDs increases.

7. The HMD of claim 1, wherein the display includes:
   a liquid crystal display pixel array arranged in rows and columns; and
   a two-dimensional array of backlight light emitting diodes (LEDs) for illuminating the liquid display pixel array, wherein a density of the backlight LEDs increases as a distance from a middle of the two-dimensional array of backlight LEDs increases.

8. The HMD of claim 1, wherein the focusing lens includes a central optical axis, and wherein the central optical axis of the focusing lens runs through the middle of the display.

9. The HMD of claim 1, wherein the illumination profile includes concentric illumination regions that increase in brightness.

10. A display comprising:
a display pixel array for generating display light;
a backlight assembly configured to illuminate the display pixel array with illumination light having an illumination profile that is non-uniform, wherein images included in the display light have the illumination profile; and
a lightguide to distribute the illumination profile that is non-uniform and that progressively increases in brightness from a middle of the lightguide to each edge of the lightguide.

11. The display of claim 10, wherein the illumination profile includes an illumination gradient that progressively increases the brightness as the distance from a middle of the display increases, a highest brightness value of the illumination gradient being at an edge of the display and a lowest brightness value of the illumination gradient being at the middle of the display.

12. The display of claim 10, wherein the backlight assembly includes:
one or more backlight emitters to provide the illumination light, wherein the lightguide is configured to receive the illumination light from the backlight emitters and distribute the illumination light to illuminate the display pixel array according to the illumination profile.

13. The display of claim 12, wherein the display is configured in an edge-lit architecture.

14. The display of claim 12, wherein the lightguide includes a gradient of light extraction features that provides the illumination profile, and wherein the light extraction features output a highest brightness value of the illumination light as a particular light extraction feature gets farther from the middle of the lightguide and gets closer to an edge of the display pixel array.

15. The display of claim 12, wherein the display pixel array includes a liquid crystal display pixel array arranged in rows and columns, and wherein the backlight emitters include light emitting diodes (LEDs).

16. The display of claim 15 further comprising:
pixel driving circuitry, wherein the LEDs are arranged in a two-dimensional array, and wherein the pixel driving circuitry is configured to drive the two-dimensional array of LEDs with increasing brightness as a distance from a middle of the two-dimensional array of LEDs increases.

17. The display of claim 15, wherein the LEDs are arranged in a two-dimensional array of light emitting diodes (LEDs) for illuminating the liquid crystal display pixel array, and wherein a density of the two-dimensional array of LEDs increases as a distance from a middle of the two-dimensional array of LEDs increases.

18. The display of claim 10, wherein the illumination profile includes concentric illumination regions that increase in brightness.

* * * * *